United States Patent
Kwon et al.

(10) Patent No.: US 10,428,240 B2
(45) Date of Patent: Oct. 1, 2019

(54) METHOD FOR PREPARING SLURRY COMPOSITION AND SLURRY COMPOSITION PREPARED THEREBY

(71) Applicant: KCTECH CO., LTD., Anseong-si (KR)

(72) Inventors: Jang Kuk Kwon, Pyeongtaek-si (KR); Chan Un Jeon, Suwon-di (KR); Ki Hwa Jung, Cheongju-si (KR); Jung Yoon Kim, Pyeongtaek-si (KR); Nak Hyun Choi, Pohang-si (KR); Seong Pyo Lee, Anseong-si (KR); Bo Hyeok Choi, Yongin-si (KR)

(73) Assignee: KCTECH CO., LTD., Anseong-si (KR)

( * ) Notice: Subject to any disclaimer, the term of this patent is extended or adjusted under 35 U.S.C. 154(b) by 366 days.

(21) Appl. No.: 15/118,723

(22) PCT Filed: Jan. 23, 2015

(86) PCT No.: PCT/KR2015/000726
§ 371 (c)(1),
(2) Date: Aug. 12, 2016

(87) PCT Pub. No.: WO2015/122634
PCT Pub. Date: Aug. 20, 2015

(65) Prior Publication Data
US 2017/0051180 A1      Feb. 23, 2017

(30) Foreign Application Priority Data

Feb. 14, 2014   (KR) .................. 10-2014-0017239

(51) Int. Cl.
*C09G 1/02*   (2006.01)
*C09K 3/14*   (2006.01)
(Continued)

(52) U.S. Cl.
CPC .............. *C09G 1/02* (2013.01); *C09K 3/1409* (2013.01); *C09K 3/1463* (2013.01);
(Continued)

(58) Field of Classification Search
CPC ...... C09G 1/02; C09K 3/1409; C09K 3/1463; H01L 21/30625; H01L 21/31055; H01L 21/31053; H01L 21/3212
See application file for complete search history.

(56) References Cited

U.S. PATENT DOCUMENTS 6,780,148 B2    8/2004   Ohinata et al.
7,303,691 B2   12/2007   Kozasa et al.
(Continued)

FOREIGN PATENT DOCUMENTS

| | | |
|---|---|---|
| CN | 1680510 A | 10/2005 |
| CN | 1733861 A | 2/2006 |
| JP | 2008-284679 A | 11/2008 |
| JP | 4796807 B2 | 10/2011 |

(Continued)

OTHER PUBLICATIONS

International Search Report dated Mar. 24, 2015 in PCT/KR2015/000726, filed Jan. 23, 2015.

*Primary Examiner* — Pegah Parvini
(74) *Attorney, Agent, or Firm* — Oblon, McClelland, Maier & Neustadt, L.L.P.

(57) ABSTRACT

The present invention relates to a method for preparing a slurry composition and a slurry composition prepared thereby, and has advantages of reducing scratches and residual particles, which are considered to be one of the biggest factors contributing to the decline in yield due to macroparticles and aggregated particles, while maintaining a high polishing rate, in a semiconductor CMP process. Furthermore, the present invention can achieve excellent results in the application to various patterns required in the ultra-large scale integration semiconductor process, the (Continued)

wafer non-uniformity (WIWNU) exhibiting a polishing rate, polishing selectivity, and polishing uniformity, which meet the needs, and the micro-scratch minimization.

26 Claims, 2 Drawing Sheets

(51) Int. Cl.
    *H01L 21/306*     (2006.01)
    *H01L 21/3105*     (2006.01)
    *H01L 21/321*     (2006.01)

(52) U.S. Cl.
    CPC .. *H01L 21/30625* (2013.01); *H01L 21/31055* (2013.01); *H01L 21/3212* (2013.01); *H01L 21/31053* (2013.01)

(56) References Cited

U.S. PATENT DOCUMENTS

| | | | |
|---|---|---|---|
| 2003/0013591 A1 | 1/2003 | Ohinata et al. | |
| 2005/0208882 A1* | 9/2005 | Cho | C09G 1/02 |
| | | | 451/41 |
| 2006/0149015 A1* | 7/2006 | Cornish | B01D 11/0284 |
| | | | 528/1 |
| 2006/0289826 A1* | 12/2006 | Koyama | C09G 1/02 |
| | | | 252/79.1 |
| 2007/0059935 A1 | 3/2007 | Kozasa et al. | |
| 2008/0254717 A1* | 10/2008 | Fukasawa | C09G 1/02 |
| | | | 451/36 |

FOREIGN PATENT DOCUMENTS

| | | |
|---|---|---|
| KR | 10-2002-0073545 A | 9/2002 |
| KR | 10-2006-0043627 A | 5/2006 |
| KR | 10-1107524 B1 | 1/2012 |

* cited by examiner

METHOD FOR PREPARING SLURRY COMPOSITION AND SLURRY COMPOSITION PREPARED THEREBY

TECHNICAL FIELD

Example embodiments relate to a method of preparing a slurry composition and a slurry composition prepared by the method.

BACKGROUND ART

With diversification and high integration of semiconductor devices, techniques for forming finer patterns are being used, and accordingly surface structures of semiconductor devices have become more complicated and step differences between surface films become greater. In manufacturing semiconductor devices, chemical mechanical polishing (CMP) is used as a planarization technique to remove a step of a particular film formed on a substrate. For example, CMP is a process for removing an insulating film excessively formed for interlayer insulation, which is widely used for planarization of an interlayer dielectric (ILD) and an insulating film for shallow trench isolation (STI) which insulates chips from each other and for formation of a metal conductive film, such as wiring, contact plug and via contact.

In CMP, a polishing speed, a planarization degree of a polished surface and an incidence of scratches are important. Such factors are determined depending on CMP conditions, slurry kinds and polishing pad types. In particular, a technique for removing large particles directly related to occurrence of scratches is more critical. When the average diameter of slurry is decreased to reduce scratches, polishing is reduced to decrease production. Thus, slurry having an appropriate size and distribution in view of polishing speed, dispersion stability and scratches is required for CMP. Further, when a small quantity of massive particles and agglomerated particles are present among particles although the particles are densely and uniformly distributed, reducing an occurrence of scratches is limited, and thus thoroughly removing the massive particles and agglomerated particles is preferable. Since even a small quantity of massive particles and agglomerated particles are included in the slurry, even a low number of scratches leads to decreased yields in CMP and subsequent STI. Accordingly a method of removing massive and agglomerated particles is required.

DISCLOSURE

Technical Goals

To solve the foregoing problems, an aspect of the present invention provides a method of preparing a slurry composition capable of removing scratches caused by massive particles and agglomerated particles and remaining particles to improve not only a polishing speed and dispersion stability required for chemical mechanical polishing (CMP), but also a planarization of a wafer and significantly reducing a scratch incidence rate, and a slurry composition prepared by the method.

However, the problems to be solved by the present invention are not limited to the foregoing problems, and other problems not mentioned herein would be clearly understood by a person skilled in the art from the following description.

Technical Solutions

According to a first aspect of the present invention, there is provided a method of preparing a slurry composition, the method including preparing a raw material slurry composition by mixing cerium oxide abrasive particles, a dispersant and water; pulverizing (milling) the cerium oxide (ceria) abrasive particles in the raw material slurry composition; removing massive particles and agglomerated particles from the raw material slurry composition by putting the raw material slurry composition containing the pulverized cerium oxide abrasive particles into a separation device including a horizontal cylindrical rotating body and centrifuging the raw material slurry composition; and obtaining a massive particles and agglomerated particles-removed slurry composition.

The raw material slurry composition may be put at 2 to 10 liters/minute (L/min).

The removing the massive particles and agglomerated particles by centrifuging the raw material slurry composition may perform centrifugation at a centrifugal force of 500 to 3,000 G.

The massive particles and agglomerated particles may closely adhere to a rotation surface of the horizontal cylindrical rotating body to move from a closed end of the horizontal cylindrical rotating body to an open end of the horizontal cylindrical rotating body and be trapped in a massive particles and agglomerated particles stopper to be removed from the raw material slurry composition.

The abrasive particles in the raw material slurry composition may have a secondary particle size of 80 to 330 nanometers (nm), and the abrasive particles in the massive particles and agglomerated particles-removed slurry composition may have a secondary particle size of 50 to 280 nm.

A solid content in the raw material slurry composition may be 1 to 20 wt %. A particle size ratio of the abrasive particles in the massive particles and agglomerated particles-removed slurry composition may be 0.3 to 1.0 by Equation 1:

$$(B_2-A_2)/(B_1-A_1), \tag{1}$$

wherein $A_1$ denotes D1 particle size before classification,
$B_1$ denotes D99 particle size before classification,
$A_2$ denotes D1 particle size after classification, and
$B_2$ denotes D99 particle size after classification.

A decrease rate of solid content in the massive particles and agglomerated particles-removed slurry composition may be less than 30% by Equation 2:

$$C_2/C_1 \times 100, \tag{2}$$

wherein $C_1$ denotes the solid content of the slurry composition before classification, and
$C_2$ denotes the solid content of the slurry composition after classification.

The method may further include subjecting the massive particles and agglomerated particles-removed slurry composition to a filter having 0.1 to 0.2 micrometer (μm) pores.

The separation device may include the horizontal cylindrical rotating body; and a raw material slurry composition introduction unit formed on a central axis of the horizontal cylindrical rotating body, the horizontal cylindrical rotating body may include an open end and a closed end, the open end may include a massive particles and agglomerated particles stopper having a step, and a raw material slurry composition inlet of the raw material slurry composition introduction unit may be formed around the closed end of the horizontal cylindrical rotating body.

A rotation surface of the horizontal cylindrical rotating body may include an uneven portion.

The separation device may further include an external case including the horizontal cylindrical rotating body, and the external case may be a horizontal cylindrical case sharing the central axis with the horizontal cylindrical rotating body and include an outlet at a bottom side of the horizontal cylindrical rotating body.

According to a second aspect of the present invention, there is provided a slurry composition prepared by the method according to the first aspect of the present invention.

Abrasive particles in the massive particles and agglomerated particles-removed slurry composition may have a secondary particle size of 50 to 280 nm.

Particle size ratio of abrasive particles in the massive particles and agglomerated particles-removed slurry composition may be 0.3 to 1.0 by Equation 1:

$$(B_2-A_2)/(B_1-A_1), \qquad (1)$$

wherein $A_1$ denotes D1 particle size before classification,
$B_1$ denotes D99 particle size before classification,
$A_2$ denotes D1 particle size after classification, and
$B_2$ denotes D99 particle size after classification.

A decrease rate of the solid content in the massive particles and agglomerated particles-removed slurry composition may be less than 30% by Equation 2:

$$C_2/C_1 \times 100, \qquad (2)$$

wherein $C_1$ denotes the solid content of the slurry composition before classification, and
$C_2$ denotes the solid content of the slurry composition after classification.

Advantageous Effects

A method of preparing a slurry composition and a slurry composition prepared thereby according to the present invention may reduce scratches and remaining particles, which are recognized as one major factor for a decrease in yield by massive particles and agglomerated particles in application to semiconductor chemical mechanical polishing (CMP), and maintain a high polishing rate. Further, the method and the slurry composition may be applied to various patterns required for a semiconductor process for ultra large scale integration and achieve excellent results in polishing rate, polishing selection ratio, within-wafer non-uniformity (WIWNU) representing polishing uniformity and minimization of microscratches for applications.

BEST MODE FOR CARRYING OUT THE INVENTION

Figure 1:
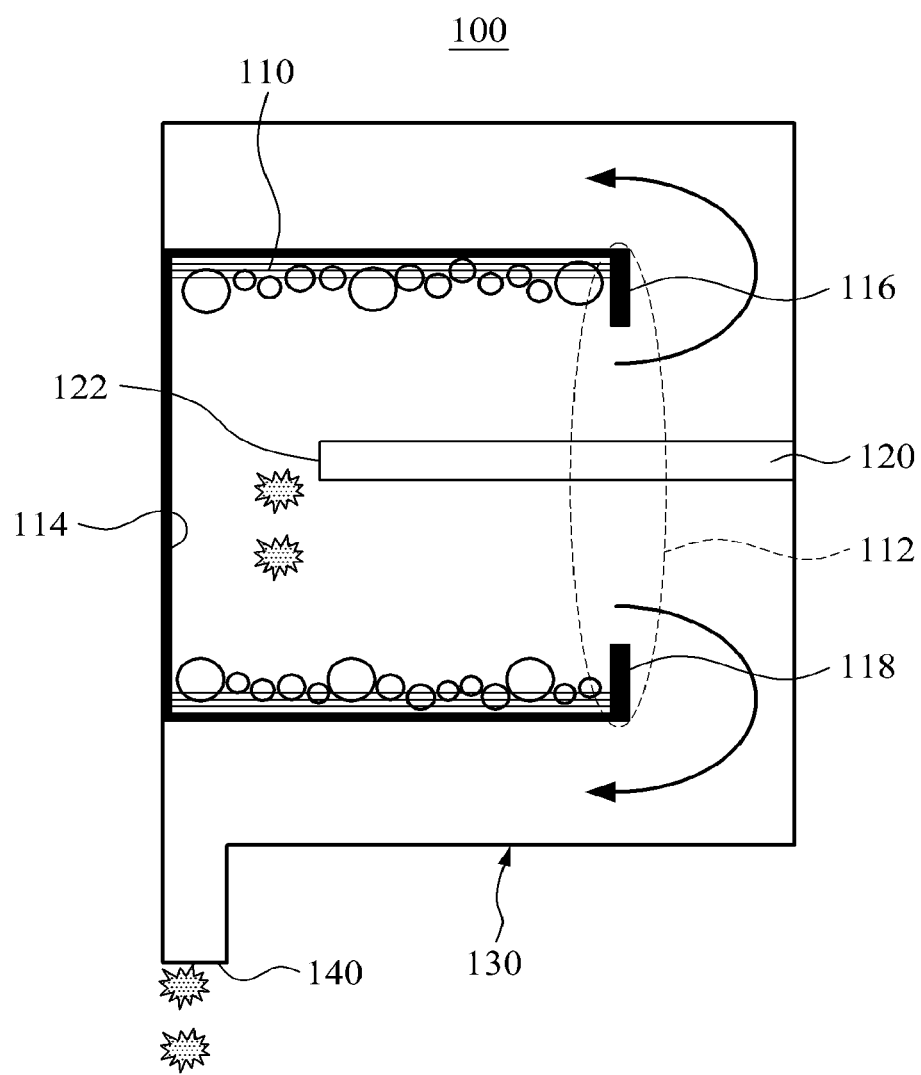
FIG. 1 is a cross-sectional view illustrating a slurry composition separation device according to an embodiment of the present invention.

Hereinafter, example embodiments of the present invention will be described in detail with reference to the accompanying drawings. When it is determined detailed description related to a related known function or configuration they may make the purpose of the present invention unnecessarily ambiguous in describing the present invention, the detailed description will be omitted here. Also, terms used herein are defined to appropriately describe the example embodiments of the present invention and thus may be changed depending on a user, the intent of an operator, or a custom. Accordingly, the terms must be defined based on the following overall description of this specification. Like reference numerals present in the drawings refer to the like elements throughout.

It will be understood throughout the whole specification that, unless specified otherwise, when one part "includes" or "comprises" one component, the part does not exclude other components but may further include the other components.

Hereinafter, a method of preparing a slurry composition and a slurry composition prepared thereby will be described in detail with reference to embodiments and drawings. However, the present invention is not limited to the embodiments and drawings.

According to a first aspect of the present invention, there is provided a method of preparing a slurry composition which includes preparing a raw material slurry composition by mixing cerium oxide abrasive particles, a dispersant and water, pulverizing the cerium oxide abrasive particles in the raw material slurry composition, removing massive particles and agglomerated particles from the raw material slurry composition by putting the raw material slurry composition containing the pulverized cerium oxide abrasive particles into a separation device including a horizontal cylindrical rotating body and subjecting the raw material slurry composition to centrifugation, and obtaining a massive particles and agglomerated particles-removed slurry composition.

The method of preparing the slurry composition according to the present invention may be conducted using the separation device including the horizontal cylindrical rotating body. In a slurry composition prepared using the separation device according to the present invention, massive particles and agglomerated particles are effectively removed without a decrease in a polished amount to reduce scratches in polishing and to decrease sizes of generated scratches, thereby minimizing defect rate by scratches.

The separation device is a slurry composition separation device which includes a horizontal cylindrical rotating body and a raw material slurry composition introduction unit formed on a central axis of the horizontal cylindrical rotating body, wherein the horizontal cylindrical rotating body includes an open end and a closed end, the open end is provided with a massive particles and agglomerated particles stopper having a step, a raw material slurry composition inlet of the raw material slurry composition introduction unit is formed around the closed end of the horizontal cylindrical rotating body.

The separation device is used for a classification process using centrifugation to remove massive particles and agglomerated particles which cause scratches in polishing, in which centrifugation is a process of classifying solid components according to magnitude of mass using a principle that concentrated solid components floating in a suspension migrate at different speeds depending on masses thereof when an external force, such as a gravitational force, is applied to the solid components.

A generally used centrifuge including a vertical cylindrical rotating body allows a raw material slurry composition to vertically rise along a wall of the rotating body to overflow by high-speed rotations, making it difficult to obtain centrifugal effects by low-speed rotations. Thus, a high particle size decrease rate and a high solid removal rate are caused. However, the slurry composition separation device including the horizontal cylindrical rotating body according to the present invention may allow the raw material slurry composition to horizontally overflow even by centrifugal force by low-speed rotations, thereby obtaining sufficient centrifugal effects.

FIG. 1 is a cross-sectional view illustrating a slurry composition separation device according to an embodiment of the present invention. Referring to FIG. 1, the slurry composition separation device 100 according to the embodiment of the present invention includes a horizontal cylindrical rotating body 110 and a raw material slurry composition introduction unit 120, and may further include an external case 130. In addition, the slurry composition separation device 100 may further include the external case 130 including the horizontal cylindrical rotating body 110 and an outlet 140 on a bottom of the external case 130.

The horizontal cylindrical rotating body 110 includes an open end 112 and a closed end 114, and the open end 112 includes massive particles and agglomerated particles stoppers 116 and 118 having a step.

The horizontal cylindrical rotating body 110 may have a radius of 50 to 500 millimeters (mm). When the radius is shorter than 50 mm, sufficient centrifugal effects may not be obtained. When the radius is longer than 500 mm, an excessive amount of time is used for classification by centrifugation, thus deteriorating productivity.

The step of the massive particles and agglomerated particles stoppers 116 and 118 may be 10 to 200 mm. Massive particles and agglomerated particles in a raw material slurry composition containing abrasive particles may closely adhere to a rotation surface of the horizontal cylindrical rotating body 110 to move from the closed end 114 of the horizontal cylindrical rotating body 110 to the open end 112 of the horizontal cylindrical rotating body 110 by centrifugal force during rotation of the horizontal cylindrical rotating body 110, and be trapped in the massive particles and agglomerated particles stoppers 116 and 118, thereby being removed from the raw material slurry composition.

The rotation surface of the horizontal cylindrical rotating body may include an uneven portion for the massive particles and agglomerated particles to effectively adhere. The uneven portion allows the massive particles and agglomerated particles to physically easily adhere to the rotation surface of the horizontal cylindrical rotating body.

The raw material slurry composition introduction unit 120 may be formed on a central axis of the horizontal cylindrical rotating body 110 and include a raw material slurry composition inlet 122. The raw material slurry composition inlet 122 may be formed around the closed end 114 of the horizontal cylindrical rotating body 110, and accordingly the raw material slurry composition may be disposed on the central axis of the horizontal cylindrical rotating body 110.

A slurry composition obtained by removing the massive particles and agglomerated particles among the abrasive particles of the raw material slurry composition by rotation of the horizontal cylindrical rotating body 110 moves to the open end 112 and is discharged over the massive particles and agglomerated particles stoppers 116 and 118.

The external case 130 is a horizontal cylindrical case sharing the central axis with the horizontal cylindrical rotating body 110. The external case 130 of the slurry composition separation device according to the embodiment of the present invention may include a horizontal rectangular case in addition to the cylindrical case and be provided with any shape capable of including the horizontal cylindrical rotating body 110, and is not limited to the preceding examples.

When the external case 130 is provided, the massive particles and agglomerated particles-removed slurry composition may be discharged via the outlet 140 at the bottom side of the horizontal cylindrical rotating body 110.

The slurry composition separation device 100 including the horizontal cylindrical rotating body 110 according to the present invention may obtain centrifugal effects even with low-speed rations as compared with a centrifugal separator including a vertical cylindrical rotating body and effectively remove the massive particles and agglomerated particles from the raw material slurry composition, thereby removing scratches and remaining particles on a wafer in polishing.

Figure 2:
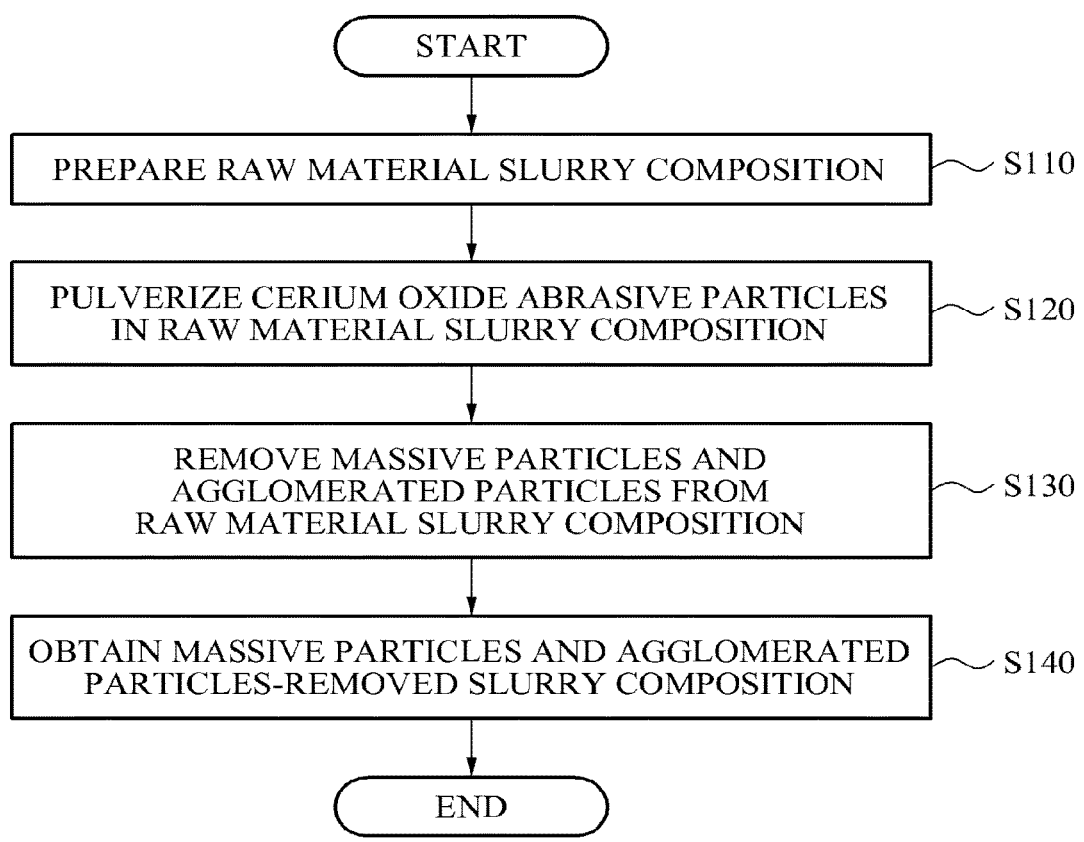
FIG. 2 is a flowchart illustrating a method of preparing a slurry composition according to an embodiment of the present invention.

FIG. 2 is a flowchart illustrating a method of preparing a slurry composition according to an embodiment of the present invention.

Cerium oxide abrasive particles, a dispersant, a pH adjuster and water are mixed in the closed end 114 of the horizontal cylindrical rotating body 110 through the raw material slurry composition introduction unit 120 of the slurry composition separation device 100 according to the embodiment of the present invention, thereby preparing a raw material slurry composition (S110).

The abrasive particles may include at least one of silica, zirconia, alumina, titania, barium titania, germania, mangania and magnesia in addition to the cerium oxide abrasive particles. The abrasive particles may be present at 0.1 to 10 wt % in the raw material slurry composition. When the abrasive particles are present at less than 0.1 wt %, polishing speed may be reduced. When the abrasive particles are present at greater than 10 wt %, defects by the abrasive particles may occur.

The dispersant serves to coat the metal oxide abrasive particles to improve dispersity of the metal oxide abrasive particles in the dispersing solution. The dispersant may include at least of ammonium salts, amine salts and aminoalcohol salts and be present at 0.1 to 10 wt % in the raw material slurry composition. When the dispersant is present at less than 0.1 wt %, slurry is less adsorbed onto a polishing surface to decrease polishing rate. When the dispersant is present at greater than 10 wt %, an excessive amount of dispersant may reduce dispersion stability to lead to agglomeration, thus causing microdefects and scratches.

The pH adjuster serves to adjust pH of the raw material slurry composition to control the dispersity of the abrasive particles. The pH adjuster may be any acid or base, and include at least one of ammonia, ammonium methyl propanol (AMP), tetramethylammonium hydroxide (TMAH), potassium hydroxide, sodium hydroxide, magnesium hydroxide, rubidium hydroxide, cesium hydroxide, sodium hydrogen carbonate, sodium carbonate, triethanolamine, tromethamine, niacinamide, nitric acid, sulfuric acid, phosphoric acid, hydrochloric acid, acetic acid, citric acid, glutaric acid, gluconic acid, formic acid, lactic acid, malic acid, malonic acid, maleic acid, oxalic acid, phthalic acid, succinic acid and tartaric acid, without being limited thereto.

A content of the pH adjuster may be in a range of 0.01 to 1 wt % in the raw material slurry composition in which the adjuster does not hinder functions of the metal oxide abrasive particles, the dispersant and other components. When the pH adjuster is present at less than 0.01 wt %, an electric repulsive force between the abrasive particles decreases to reduce storage stability to cause massive particles by agglomeration, thus resulting in defects including fine scratches after polishing. When the pH adjuster is present at greater than 1 wt %, a surface of a wafer on which a nitride layer is deposited is negatively charged in a chemical mechanical polishing (CMP) process, such as a shallow trench isolation (STI) process, so that polishing speed may be reduced.

A remaining component of the raw material slurry composition for CMP according to the present invention, water, may preferably be ultrapure water.

The cerium oxide abrasive particles in the raw material slurry composition are pulverized (S120).

The foregoing pulverizing process is a process for pulverizing relatively weakly cohesive secondary metal oxide particles which are agglomerated to a desired diameter and evenly dispersing the metal oxide abrasive particles in the dispersing solution, which is essential for adjusting size, uniformity and dispersion stability degree of the particles. The pulverizing process may be performed using grinding with beads or ultrasonic milling, preferably jet milling. Jet milling is a method of allowing the abrasive particles in the abrasive particles dispersing solution to collide with each other to be destroyed, which causes less slurry contamination and applies an overall uniform impact, thereby pulverizing the particles to a uniform size and providing excellent productivity.

The pulverizing process may be performed using various types of jet milling equipment, such as a Nanomizer, Microfluidizer and Ultimizer.

The pulverizing process may be performed at a collision pressure of the mixture solution of 500 to 3,000 kilogram force/square centimeter ($kgf/cm^2$). Alternatively, the collision pressure may be 700 to 3000 $kgf/cm^2$ or 1000 to 3000 $kgf/cm^2$. When the collision pressure is lower than 500 $kgf/cm^2$, it is difficult to pulverize the particles. When the collision pressure is greater than 3000 $kgf/cm^2$, the particles are pulverized into too small particles and economic efficiency is unfavorable.

The pulverizing process includes beads, in which dispersing and pulverizing processes are successively performed by impact energy, friction energy and shear stress by collisions between the beads and by collisions between the particles.

The raw material slurry composition containing the pulverized cerium oxide abrasive particles is disposed in the separation device including the horizontal cylindrical rotating body and is subjected to centrifugation, thereby removing massive particles and agglomerated particles from the raw material slurry composition (S130).

The raw material slurry composition may be put at 2 to 10 liters/minute (L/min). When the raw material slurry composition is put at less than 2 L/min, efficiency is good but production time is long to deteriorate efficiency. When the raw material slurry composition is put at greater than 10 L/min, an excessive amount of the raw material slurry composition is subjected to centrifugal force for an insufficient period of time in the horizontal cylindrical rotating body 110 of the slurry composition separation device 100, so that the massive particles and agglomerated particles may not be easily removed.

Centrifuging the raw material slurry composition to remove the massive particles and agglomerated particles may be performed at a centrifugal force of, for example, 500 to 3,000 G preferably 500 to 2,500 G and more preferably 1,500 to 2,500 G.

The massive particles and agglomerated particles in the raw material slurry composition closely adhere to the rotation surface of the horizontal cylindrical rotating body 110 rotating at 500 to 3,000 G to horizontally move from the closed end 114 of the horizontal cylindrical rotating body 110 to the open end 112 of the horizontal cylindrical rotating body 110, so that the massive particles and agglomerated particles, which are subjected to a great centrifugal force, are attached to an inner wall and trapped in the massive particles and agglomerated particles stoppers 116 and 118 to be removed from the raw material slurry composition, whereas particles with small sizes horizontally pass through the horizontal cylindrical rotating body 110 over the massive particles and agglomerated particles stoppers 116 and 118, without being attached to the inner wall.

A centrifuge including a vertical cylindrical rotating body allows a raw material slurry composition to vertically rise along a wall of the rotating body to overflow by high-speed rotations, making it difficult to obtain centrifugal effects by low-speed rotations. Thus, a result is a high particle size decrease rate and a high solid removal rate. However, the slurry composition separation device 100 including the horizontal cylindrical rotating body 110 according to the present invention may allow the raw material slurry composition to horizontally overflow even by centrifugal force by low-speed rotations at 500 to 2500 G, thereby obtaining sufficient centrifugal effects.

A massive particles and agglomerated particles-removed slurry composition is obtained (S140).

Secondary particle size of the abrasive particles may be measured using a laser scattering particle size distribution analyzer, such as Horiba LA-910. The secondary particle size of the abrasive particles in the raw material slurry composition may be 80 to 330 nm, and the secondary particle size of the abrasive particles in the massive particles and agglomerated particles-removed slurry composition may be 50 to 280 nm. A particle size refers to distribution of particles, which represents an average particle size. A decrease in secondary particle size after centrifugation is due to a decrease in average particle size since the massive particles and agglomerated particles are removed by centrifugation Thus, a decrease in minimum secondary particle size after centrifugation from 80 nm to 50 nm is due to a decrease in average particle size since the massive particles and agglomerated particles are absent in the massive particles and agglomerated particles-removed slurry composition.

A particle size ratio of the abrasive particles in the massive particles and agglomerated particles-removed slurry composition may be 0.3 to 1.0 according to Equation 1.

$$(B_2-A_2)/(B_1-A_1) \quad (1)$$

In Equation 1, $A_1$ denotes D1 particle size before classification, $B_1$ denotes D99 particle size before classification, $A_2$ denotes D1 particle size after classification, and $B_2$ denotes D99 particle size after classification.

When the particle size ratio of the abrasive particles in the massive particles and agglomerated particles-removed slurry composition after centrifugation is less than 0.3, residues, such as the massive particles and agglomerated particles, are insufficiently removed by centrifugation, and accordingly scratch incidence rate after polishing is increased. When the particles size ratio is greater than 1.0, content of the abrasive particles after centrifugation is significantly reduced as compared with content of the abrasive particles before centrifugation, so that a yield is remarkably decreased.

A solid content in the raw material slurry composition may be 1 to 20 wt %. When the solid content in the raw material slurry composition is greater than 20%, which means the massive particles and agglomerated particles are insufficiently removed, scratch incidence rate after polishing is increased.

A decrease rate of the solid content in the massive particles and agglomerated particles-removed slurry composition may be less than 30%, preferably less than 20 by Equation 2.

$$C_2/C_1 \times 100 \qquad (2)$$

In Equation 2, $C_1$ denotes solid content of the slurry composition before classification, and $C_2$ denotes solid content of the slurry composition after classification.

When the decrease rate of the solid content in the massive particles and agglomerated particles-removed slurry composition is 30% or greater, not only abnormal particles, such as the massive particles and agglomerated particles, but also normal particles are removed. Further, high ratios of massive particles and agglomerated particles are exhibited when compared to a slurry composition having a decrease rate of solid content of less than 30% when compared with a slurry composition having the same secondary particle size.

For example, a slurry composition having a solid removal rate of 30% or higher exhibits a particle size ratio of 0.3 or lower or 0.95 or higher after classification, and a slurry composition having a solid removal rate of less than 30% has a particle size ratio of 0.03 to 0.95 after classification. In this case, when the slurry compositions are compared in massive particle and scratch levels, the slurry composition having a solid removal rate of less than 30% has excellent improvement effects.

The method of preparing the slurry composition according to the present invention includes preparing a slurry composition in which numbers of massive particles and agglomerated particles among abrasive particles are adjusted according to sizes of the abrasive particles depending on solid content of the slurry composition. When the solid content of the slurry composition is decreased, the numbers of massive particles and agglomerated particles are decreased, in which degree of the decrease in the numbers of the massive particles and agglomerated particles caused by the decrease in the solid content of the slurry increases with particle sizes being greater by particle size. In particular, degree of the decrease in the number of the massive abrasive particles caused by the decrease in the solid content tends to drastically increase. That is, when the solid content is decreased to ½ the degree of the decrease in the numbers of the massive particles and agglomerated particles is ½ or greater. Also, this tendency becomes remarkable as the massive particles and agglomerated particles have a larger size, whereas a change in the number of the particles is relatively slight when the particles have a small size. Based on a solid content of 2.0 wt % in the massive particles and agglomerated particles-removed slurry composition, an accumulated number of abrasive particles with a diameter of 1.99 micrometers (μm) or greater may be $2.0E \times 10^3$/milliliters (ml) or less, an accumulated number of abrasive particles with a diameter of 1.00 μm or greater may be $3.0E \times 10^5$/ml or less, and an accumulated number of abrasive particles with a diameter of 0.70 μm or greater may be $3.0E \times 10^8$/ml or less.

In the present invention, not only the massive particles and agglomerated particles but fine particles are also removed by centrifugation, thereby reducing scratches and defects.

The method may further include subjecting the massive particles and agglomerated particles-removed slurry composition to a filter having 0.1 to 0.2 μm pores. The filter may include at least one selected from the group consisting of a membrane filter, a depth filter and a pleated filter.

According to a second aspect of the present invention, there is provided a slurry composition prepared by the preparing method according to the first aspect of the present invention.

Abrasive particles in a massive particles and agglomerated particles-removed slurry composition may have a secondary particle size of 50 to 280 nm.

Particle size ratio of the abrasive particles in the massive particles and agglomerated particles-removed slurry composition may be 0.3 to 1.0 according to Equation 1.

$$(B_2-A_2)/(B_1-A_1) \qquad (1)$$

In Equation 1, $A_1$ denotes D1 particle size before classification, $B_1$ denotes D99 particle size before classification, $A_2$ is D1 particle size after classification, and $B_2$ denotes D99 particle size after classification.

When the particle size ratio of the abrasive particles in the massive particles and agglomerated particles-removed slurry composition after centrifugation is less than 0.3, residues, such as the massive particles and agglomerated particles, are insufficiently removed by centrifugation, and accordingly scratch incidence rate after polishing is increased. When the particles size ratio is greater than 1.0, content of the abrasive particles after centrifugation is significantly reduced as compared with content of the abrasive particles before centrifugation, so that a yield is remarkably decreased.

A decrease rate of solid content in the massive particles and agglomerated particles-removed slurry composition may be less than 30%, preferably less than 20% by Equation 2.

$$C_2/C_1 \times 100 \qquad (2)$$

In Equation 2, $C_1$ denotes solid content of the slurry composition before classification, and $C_2$ is solid content of the slurry composition after classification.

When the decrease rate of the solid content in the massive particles and agglomerated particles-removed slurry composition is 20% or greater, not only abnormal particles, such as the massive particles and agglomerated particles, but also normal particles are removed. Further, high ratios of massive particles and agglomerated particles are exhibited when compared to a slurry composition having a decrease rate of solid content of less than 20% when compared with a slurry composition having the same secondary particle size.

Based on a solid content of 2.0 wt % in the massive particles and agglomerated particles-removed slurry composition, an accumulated number of abrasive particles with a diameter of 1.99 μm or greater may be $2.0E \times 10^3$/ml or less, an accumulated number of abrasive particles with a diameter of 1.00 μm or greater may be $3.0E \times 10^5$/ml or less, and an accumulated number of abrasive particles with a diameter of 0.70 μm or greater may be $3.0E \times 10^8$/ml or less.

The slurry composition of the present invention may reduce scratches and remaining particles, which are recognized as a major factor of decreasing a yield by massive particles and agglomerated particles, and maintaining a high polishing rate. Further, the slurry composition may be applied to various patterns required for a semiconductor process for ultra large scale integration and achieve excellent results in polishing rate, polishing selection ratio, within-wafer non-uniformity (WIWNU) representing polishing uniformity and minimization of microscratches for applications.

Although a few example embodiments of the present invention have been shown and described with reference to the accompanying drawings, the present invention is not limited to the described example embodiments. Instead, it will be apparent to those skilled in the art that various modifications and variations may be made from the foregoing descriptions. Therefore, the scope of the present invention is not limited by the aforementioned embodiments but is defined by the appended claims and their equivalents.

The invention claimed is:

1. A method of preparing a slurry composition, the method comprising:
   preparing a raw material slurry composition by mixing cerium oxide abrasive particles, a dispersant and water;
   pulverizing the cerium oxide abrasive particles in the raw material slurry composition;
   removing massive particles and agglomerated particles from the raw material slurry composition by putting the raw material slurry composition containing the pulverized cerium oxide abrasive particles into a separation device comprising a horizontal cylindrical rotating body and centrifuging the raw material slurry composition; and
   obtaining a massive particles and agglomerated particles-removed slurry composition,
   wherein a particle size ratio of the abrasive particles in the massive particles and agglomerated particles-removed slurry composition is 0.3 to 1.0 by Equation 1:

$$(B_2-A_2)/(B_1-A_1),\quad\text{[Equation 1]}$$

wherein $A_1$ denotes D1 particle size before classification,
   $B_1$ denotes D99 particle size before classification,
   $A_2$ denotes D1 particle size after classification, and
   $B_2$ denotes D99 particle size after classification.

2. The method of claim 1, wherein the raw material slurry composition is put at 2 to 10 liters/minute (L/min).

3. The method of claim 1, wherein the removing the massive particles and agglomerated particles by centrifuging the raw material slurry composition performs centrifugation at a centrifugal force of 500 to 3,000 G.

4. The method of claim 1, wherein the massive particles and agglomerated particles closely adhere to a rotation surface of the horizontal cylindrical rotating body to move from a closed end of the horizontal cylindrical rotating body to an open end of the horizontal cylindrical rotating body and are trapped in a massive particles and agglomerated particles stopper to be removed from the raw material slurry composition.

5. The method of claim 1, wherein the abrasive particles in the raw material slurry composition have a secondary particle size of 80 to 330 nanometers (nm), and the abrasive particles in the massive particles and agglomerated particles-removed slurry composition have a secondary particle size of 50 to 280 nm.

6. The method of claim 1, wherein a solid content in the raw material slurry composition is 1 to 20 wt %.

7. The method of claim 1, wherein a decrease rate of solid content in the massive particles and agglomerated particles-removed slurry composition is less than 30% by Equation 2:

$$C_2/C_1\times 100,\quad\text{[Equation 2]}$$

wherein $C_1$ denotes the solid content of the slurry composition before classification, and
   $C_2$ denotes the solid content of the slurry composition after classification.

8. The method of claim 1, further comprising subjecting the massive particles and agglomerated particles-removed slurry composition to a filter having 0.1 to 0.2 micrometer (μm) pores.

9. The method of claim 1, wherein the separation device comprises the horizontal cylindrical rotating body; and a raw material slurry composition introduction unit formed on a central axis of the horizontal cylindrical rotating body, the horizontal cylindrical rotating body comprises an open end and a closed end, the open end comprises a massive particles and agglomerated particles stopper having a step, and a raw material slurry composition inlet of the raw material slurry composition introduction unit is formed around the closed end of the horizontal cylindrical rotating body.

10. The method of claim 9, wherein a rotation surface of the horizontal cylindrical rotating body comprises an uneven portion.

11. The method of claim 9, wherein the separation device further comprises an external case comprising the horizontal cylindrical rotating body, and the external case is a horizontal cylindrical case sharing the central axis with the horizontal cylindrical rotating body and comprises an outlet at a bottom side of the horizontal cylindrical rotating body.

12. A massive particles and agglomerated particles-removed slurry composition prepared by the method of claim 1.

13. The slurry composition of claim 12, wherein abrasive particles in the massive particles and agglomerated particles-removed slurry composition have a secondary particle size of 50 to 280 nm.

14. The slurry composition of claim 12, wherein a decrease rate of the solid content in the massive particles and agglomerated particles-removed slurry composition is less than 30% by Equation 2:

$$C_2/C_1\times 100,\quad\text{[Equation 2]}$$

wherein $C_1$ denotes the solid content of the slurry composition before classification, and $C_2$ denotes the solid content of the slurry composition after classification.

15. A method of preparing a slurry composition, the method comprising:
   preparing a raw material slurry composition by mixing cerium oxide abrasive particles, a dispersant and water;
   pulverizing the cerium oxide abrasive particles in the raw material slurry composition;
   removing massive particles and agglomerated particles from the raw material slurry composition by putting the raw material slurry composition containing the pulverized cerium oxide abrasive particles into a separation device comprising a horizontal cylindrical rotating body and centrifuging the raw material slurry composition; and
   obtaining a massive particles and agglomerated particles-removed slurry composition,
   wherein a decrease rate of solid content in the massive particles and agglomerated particles-removed slurry composition is less than 30% by Equation 2:

$$C_2/C_1\times 100,\quad\text{[Equation 2]}$$

wherein $C_1$ denotes the solid content of the slurry composition before classification, and
   $C_2$ denotes the solid content of the slurry composition after classification.

16. The method of claim 15, wherein the raw material slurry composition is put at 2 to 10 liters/minute (L/min).

17. The method of claim 15, wherein the removing the massive particles and agglomerated particles by centrifuging the raw material slurry composition performs centrifugation at a centrifugal force of 500 to 3,000 G.

18. The method of claim 15, wherein the massive particles and agglomerated particles closely adhere to a rotation surface of the horizontal cylindrical rotating body to move from a closed end of the horizontal cylindrical rotating body to an open end of the horizontal cylindrical rotating body and are trapped in a massive particles and agglomerated particles stopper to be removed from the raw material slurry composition.

19. The method of claim 15, wherein the abrasive particles in the raw material slurry composition have a secondary particle size of 80 to 330 nanometers (nm), and the abrasive particles in the massive particles and agglomerated particles-removed slurry composition have a secondary particle size of 50 to 280 nm.

20. The method of claim 15, wherein a solid content in the raw material slurry composition is 1 to 20 wt %.

21. The method of claim 15, further comprising subjecting the massive particles and agglomerated particles-removed slurry composition to a filter having 0.1 to 0.2 micrometer (μm) pores.

22. The method of claim 15, wherein the separation device comprises the horizontal cylindrical rotating body; and a raw material slurry composition introduction unit formed on a central axis of the horizontal cylindrical rotating body, the horizontal cylindrical rotating body comprises an open end and a closed end, the open end comprises a massive particles and agglomerated particles stopper having a step, and a raw material slurry composition inlet of the raw material slurry composition introduction unit is formed around the closed end of the horizontal cylindrical rotating body.

23. The method of claim 22, wherein a rotation surface of the horizontal cylindrical rotating body comprises an uneven portion.

24. The method of claim 22, wherein the separation device further comprises an external case comprising the horizontal cylindrical rotating body, and the external case is a horizontal cylindrical case sharing the central axis with the horizontal cylindrical rotating body and comprises an outlet at a bottom side of the horizontal cylindrical rotating body.

25. A massive particles and agglomerated particles-removed slurry composition prepared by the method of claim 15.

26. The slurry composition of claim 25, wherein abrasive particles in the massive particles and agglomerated particles-removed slurry composition have a secondary particle size of 50 to 280 nm.

* * * * *